United States Patent
Wu et al.

(10) Patent No.: US 10,080,297 B2
(45) Date of Patent: Sep. 18, 2018

(54) POWER SUPPLY MODULE

(71) Applicant: Sumida Electric (H.K.) Company Limited, Hong Kong (CN)

(72) Inventors: Zhuo Wu, Hong Kong (CN); Douglas James Malcolm, Algonquin, IL (US); Yanfei Liu, Kingston (CA)

(73) Assignee: Sumida Electric (H.K.) Company Limited, Hong Kong (CN)

( * ) Notice: Subject to any disclaimer, the term of this patent is extended or adjusted under 35 U.S.C. 154(b) by 261 days.

(21) Appl. No.: 14/265,652

(22) Filed: Apr. 30, 2014

(65) Prior Publication Data
US 2014/0328042 A1   Nov. 6, 2014

(30) Foreign Application Priority Data
May 3, 2013 (CN) .......................... 2013 1 0160722

(51) Int. Cl.
| | | |
|---|---|---|
| *H01F 5/00* | (2006.01) | |
| *H01F 27/28* | (2006.01) | |
| *H05K 3/32* | (2006.01) | |
| *H01F 27/40* | (2006.01) | |
| *H01F 27/29* | (2006.01) | |
| *H01F 17/04* | (2006.01) | |

(52) U.S. Cl.
CPC ............ *H05K 3/32* (2013.01); *H01F 27/292* (2013.01); *H01F 27/40* (2013.01); *H01F 2017/048* (2013.01); *H01L 2924/0002* (2013.01); *Y10T 29/49147* (2015.01)

(58) Field of Classification Search
CPC .................................. H01F 5/00; H01F 27/28
USPC .................................................. 336/200, 232
See application file for complete search history.

(56) References Cited

U.S. PATENT DOCUMENTS

| | | | | |
|---|---|---|---|---|
| 2004/0239467 A1* | 12/2004 | Liu | ....................... | H01F 27/027 336/200 |
| 2009/0207574 A1* | 8/2009 | Chen | ..................... | H05K 1/181 361/761 |
| 2011/0242775 A1* | 10/2011 | Schaible | ................ | H01F 17/04 361/752 |

FOREIGN PATENT DOCUMENTS

| | | |
|---|---|---|
| CN | 1838348 A | 9/2006 |
| CN | 102256443 A | 11/2011 |
| CN | 102857088 A | 1/2013 |
| JP | 11299225 A | * 10/1999 |
| JP | 2003188023 A | * 7/2003 |

(Continued)

OTHER PUBLICATIONS

SIPO, second Office Action corresponding to CN Application No. 201310160722.9; dated Sep. 29, 2016.

*Primary Examiner* — Tsz Chan
(74) *Attorney, Agent, or Firm* — Seyfarth Shaw LLP

(57) ABSTRACT

A power supply module and a method for manufacturing the same are disclosed. The power supply module includes: a coil including a coil body and a connecting terminal; electronic components at least including an integrated circuit chip; a connector configured to be electrically connected with the coil and the electronic component; and a magnetic conductor configured to enclose in and around the coil body and the electronic component, wherein the connector is integrally formed with the integrated circuit chip when manufacturing the latter. The present disclosure can make the structure of the power supply module be more compact to further meet the needs of miniaturization design, reduce material consumption, simplify procedure, and therefore reduce the production costs.

9 Claims, 3 Drawing Sheets

(56) References Cited

FOREIGN PATENT DOCUMENTS

| JP | 2010022098 A | * | 1/2010 |
| JP | 2011222598 A | * | 11/2011 |
| JP | 2012234986 A | * | 11/2012 |

* cited by examiner

POWER SUPPLY MODULE

FIELD OF THE INVENTION

The present disclosure relates generally to the field of power supply, and specifically to a power supply module.

BACKGROUND OF THE INVENTION

In the field of electronic products, with the development of miniaturization and integration in the electronic industry, in order to provide an accurate voltage and an accurate current for an operation of an electronic product, electronic components such as inductance, capacitance, resistance and integrated circuit chip, are integrated into one power supply module, for example, Power Supply in Package, to perform voltage or current conversion, which is convenient for engineer to develop and for the customer to use.

The traditional way for integrating a power supply module is that: the above electronic components are electrically connected together in advance, for example, all of the electronic components are mounted on a printed circuit board, and then encapsulated by resin from outside to form an integrated structure of the power supply module, as shown in FIG. 1. When the electronic components such as inductance, capacitance, resistance, integrated circuit chip, are connected, these electronic components are mostly electrically connected together by a circuit design around ports of the integrated circuit chip. In the production process, two circuit design iterations are normally needed for the engineer, one is to design a lead frame in the integrated circuit and when the integrated circuits mold by a encapsulating approach, the outer peripheral part of the lead frame will be cut out to form a terminal for users, the other is to design a lead frame when inductance, capacitance, resistance and other electronic components are integrated with the integrated circuit. In addition, after the above electronic components mounted on a printed circuit board to form a power supply module, the printed circuit board needs to be provided with ports that can be used by a user. For example, in a patent JP2001386984, as shown in FIG. 1, an electronic part 40 (such as integrated circuit) is mounted on a component connection department 31 by electronic connection (equivalent to a First circuit design), the end of a winding of a coil 10 is electronically connected with different coil connection departments 32 (equivalent to a second circuit design), the multiple port electrodes 30, the component connection department 31 and the coil connection departments 32 are integrally molded, and an electronic circuit module formed by pressing forming by a magnetic body 20 in the end.

Therefore, if simply combining each electronic component and integrated circuit together to form a power supply module according to method in the prior art, it not only increases production materials so as to make the production process more complicate, but also causes waste and increased cost.

SUMMARY OF THE INVENTION

In order to solve the above problems in the prior art, the object of the present disclosure is to provide a power supply module and a method for manufacturing the same.

According to an aspect of the present disclosure, a power supply module includes:

a coil, including a coil body and a connecting terminal;

electronic components, including at least an integrated circuit chip;

a connection, configured to be electrically connected with the coil and the electronic component; and a magnetic conductor, configured to enclose in and around the coil body and the electronic component, wherein the connector is integrally formed with the integrated circuit chip when manufacturing the latter.

Preferably, electronic components also include a resistor and/or a capacitor.

Preferably, the connector includes a terminal configured to be electrically connected with external circuit.

Preferably, the connector is a lead frame.

Preferably, the magnetic conductor is formed from magnetic powder by an encapsulating approach.

Preferably, the encapsulating approach can be molding or potting.

According to another aspect the present disclosure, a method for manufacturing the power supply module includes the following steps:

integrally forming a connector when manufacturing an integrated circuit chip;

electrically connecting the connector with a coil and electronic components at least including an integrated circuit chip, wherein the coil includes a coil body and a connecting terminal; and enclose in and around the coil body and the electronic component with a magnetic conductor.

Preferably, the electronic components also include a resistance and/or a capacitance.

Preferably, the connector is a lead frame.

Preferably, the method also includes a step of cutting out the outer peripheral portion of the lead frame to make a terminal that can be used by a user.

With the above technical solution or the present disclosure, the structure of the power supply module is more compact and can better meet the needs of the miniaturization design, which reduces material consumption, simplifies procedure, reduces production costs and improve the performance.

DETAILED DESCRIPTION OF THE INVENTION

The present disclosure may be best understood by reference to the following description taken in conjunction with embodiments and reference to the accompanying drawings.

Figure 2:
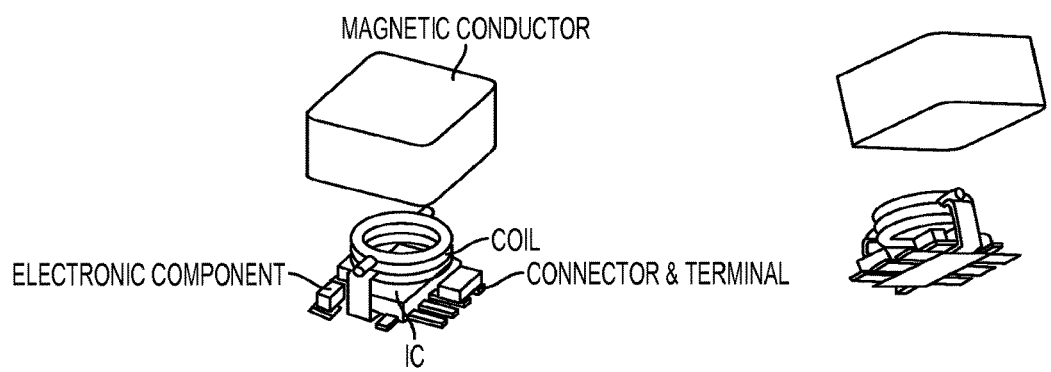
FIG. 2 is a structural diagram for illustrating a power supply module according to one embodiment of the present disclosure.

According to an aspect of the present disclosure, a power supply module is provided. As shown in FIG. 2, in one embodiment of the present disclosure, the power supply module includes a coil, electronic components, a connector and a magnetic conductor.

The coil includes a coil body and a connecting terminal, and preferably, the coil is a hollow coil.

The coil is preferably made of a flat copper wire, a round copper wire or a wound wire of other shapes and is wound according to a certain number of turns and shape in advance.

The electronic components include at least an integrated circuit chip which is a unit module preferably integrated a MOSFET, a drive circuit, a pulse width modulator and a controller. In another embodiment of the present disclosure, the electronic components also include a resistor, a capacitor or other electronic components.

One or more integrated circuit chips can be provided upon the demands in use.

The connector is electrically connected with the coil and the electronic components, for example, each connecting terminal of the coil can be respectively electrically connected with a corresponding terminal of the connector.

Wherein, the connector is integrally formed with the integrated circuit chip when manufacturing the latter.

In one embodiment of the present disclosure, the connector is a lead frame, all the electronic components are electrically connected to the lead frame, and preferably, a part of the outer periphery of the lead frame corresponding to the connecting terminal of the coil, which is bent upward, is electrically connected with the connecting terminal of the coil. In this way, only one circuit design is needed in the present disclosure, one circuit design is saved compared with the prior art, so as to reduce material consumption.

In addition, the setting of the connector can reduce damage to the integrated circuit chip that the integrated circuit chip is not easily affected by external electromagnetic interference, so as to improve the electromagnetic interference performance with the proposed structure, effectively resolve the electromagnetic interference problem in an integrated circuit chip. In addition, the integrated circuit will contact with the magnetic core and therefore, the heat from the integrated circuit can be transferred through the magnetic core to ambient. Therefore, the heat transfer characteristics can be improved.

In another embodiment of the present disclosure, the connector includes a terminal configured to be electrically connected to an external device.

The magnetic conductor encloses in and around the coil body and the electronic components. The magnetic conductor is generally designed in a cuboid or cube shape, and also can be designed in a cylinder shape or other shapes upon the demands in use.

In one embodiment of the present disclosure, the magnetic conductor is formed from magnetic powder by molding, potting or other encapsulating approaches.

Figure 3:
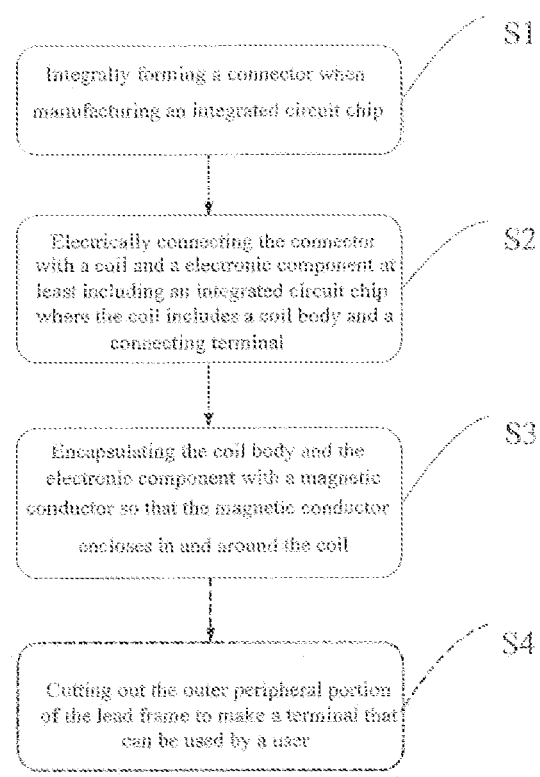
FIG. 3 is a flow diagram or illustrating a method for manufacturing the power supply module according to one embodiment of the present disclosure.

According to another aspect of the present disclosure, a manufacturing method for the power supply module is provided. As shown in FIG. 3 in one embodiment of the present disclosure, the method includes the following steps:

Step S1, integrally forming a connector when manufacturing an integrated circuit chip.

Preferably, the connector is a lead frame.

Step S2, electrically connecting the connector with a coil and electronic components at least including an integrated circuit chip, where the coil includes a coil body and a connecting terminal.

The integrated circuit chip is a unit module integrating a MOSFET, a drive circuit, a pulse width modulator and a controller. In another embodiment of the present disclosure, the electronic components also include a resistor, a capacitor or other electronic components.

In one embodiment of the present disclosure, each connecting terminal of the coil can be respectively electrically connected with a corresponding terminal of the connector that the coil and other electronic components can be connected into a whole circuit by the lead frame.

Step S3, encapsulating the coil body and the electronic component with a magnetic conductor so that the magnetic conductor encloses in and around the coil.

In one embodiment of the present disclosure, the magnetic conductor is formed from magnetic powder by molding, potting or other encapsulating approaches, namely the whole circuit is covered by the magnetic powder in the way of molding or other encapsulating approaches to form an entirety.

If the connector is a lead frame, the method also includes:

cutting out the outer peripheral portion of the lead frame to make a terminal that can be used by a user.

Figure 4:
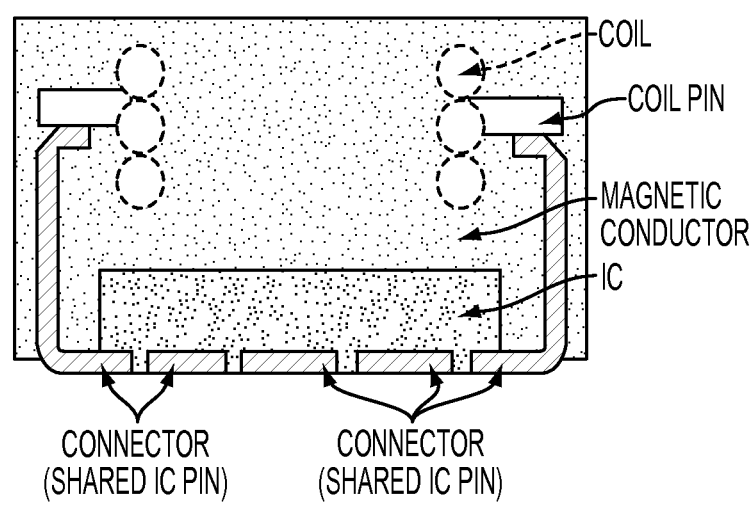
FIG. 4 is a sectional view for illustrating a manufactured power supply module according to one embodiment of the present disclosure.

FIG. 4 is a sectional view illustrating a manufactured power supply module according to one embodiment of the present disclosure. It can be observed from FIG. 4 that, the integrated circuit chip is electrically connected with the lead frame, two connecting terminals (pins) of the coil are respectively electrically connected to the corresponding terminals of the lead frame, the whole circuit connected by the coil and the integrated circuit chip is covered by the magnetic powder in the way of molding or other encapsulating approaches, and the peripheral portion of the lead frame is cut off to form coils pin and IC pins that can be used by a user.

Figure 1:
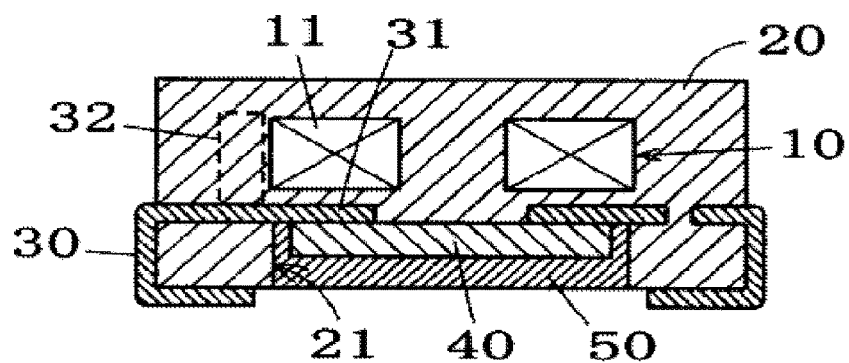
FIG. 1 is a sectional view for illustrating an electronic circuit module formation in the prior art.

Therefore, compared with the power supply module in the prior art as shown in FIG. 1, the power supply module of the present disclosure has the following advantages:

1. making the structure more compact to better meet the needs of the miniaturization design; and 2. reducing material consumption and simplifying procedure and therefore reducing production costs.

The embodiments are chosen and described in order to explain the basic idea of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power supply module, comprising:
    an integrated circuit chip;
    a single lead frame integrally formed with and electrically connected to the integrated circuit chip as a single circuit design for connecting other electronic components;
    a coil electrically connected to the lead frame, the coil including a coil body and a connecting terminal;
    an electronic component mounted directly on and electrically connected to the lead frame; and
    a magnetic conductor enclosing the coil body, the integrated circuit chip, and the electronic component.

2. The power supply module of claim 1, wherein the coil is a hollow coil.

3. The power supply module of claim 1, wherein the electronic component includes a resistance and/or a capacitance.

4. The power supply module of claim 1, wherein the lead frame includes a terminal configured to be electrically connected to an external circuit.

5. The power supply module of claim 1, wherein the magnetic conductor is formed from magnetic powder by an encapsulating approach.

6. The power supply module of claim 5, wherein the encapsulating approach is molding or potting.

7. A method for manufacturing a power supply module, comprising:
- integrally forming one lead frame with an integrated circuit chip as a single circuit design for connecting other electronic components during manufacturing of the integrated circuit chip;
- electrically connecting a coil to the lead frame, wherein the coil includes a coil body and a connecting terminal;
- mounting an electronic component directly on the lead frame; and
- enclosing the coil body, the integrated circuit chip, and the electronic component with a magnetic conductor.

8. The method of claim 7, wherein the method further comprises:
- cutting out an outer peripheral portion of the lead frame forming a terminal.

9. The power supply module of claim 1, wherein a terminal of the single lead frame integrally formed with and extending from the integrated circuit chip bends around the integrated circuit chip to connect to the connecting terminal of the coil.

* * * * *